(12) United States Patent
Huang et al.

(10) Patent No.: US 11,980,072 B2
(45) Date of Patent: May 7, 2024

(54) DISPLAY DEVICE

(71) Applicant: Au Optronics Corporation, Hsinchu (TW)

(72) Inventors: Zih-Shuo Huang, Hsinchu (TW); Tsung-Ying Ke, Hsinchu (TW); Shang-Kai Shen, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 421 days.

(21) Appl. No.: 17/513,912

(22) Filed: Oct. 29, 2021

(65) Prior Publication Data
US 2023/0021112 A1 Jan. 19, 2023

(30) Foreign Application Priority Data
Jul. 13, 2021 (TW) ................. 110125760

(51) Int. Cl.
*H10K 59/131* (2023.01)
*H10K 50/80* (2023.01)
*H10K 77/10* (2023.01)

(52) U.S. Cl.
CPC .......... *H10K 59/131* (2023.02); *H10K 50/80* (2023.02); *H10K 77/111* (2023.02)

(58) Field of Classification Search
CPC .... H10K 59/131; H10K 50/80; H10K 77/111; H01L 27/124; H01L 27/153; G09F 9/301
See application file for complete search history.

(56) References Cited

U.S. PATENT DOCUMENTS

| | | | |
|---|---|---|---|
| 8,883,287 B2 | 11/2014 | Boyce et al. | |
| 10,135,011 B2 | 11/2018 | Park et al. | |
| 10,826,002 B2 | 11/2020 | Park et al. | |
| 2017/0279057 A1 | 9/2017 | Park et al. | |
| 2019/0088894 A1 | 3/2019 | Park et al. | |
| 2020/0410906 A1* | 12/2020 | Chen | H10K 59/40 |
| 2021/0083211 A1 | 3/2021 | Park et al. | |

FOREIGN PATENT DOCUMENTS

| | | |
|---|---|---|
| CN | 107221550 | 9/2017 |
| CN | 109860119 | 6/2019 |
| CN | 111276528 | 6/2020 |
| CN | 112133198 | 12/2020 |
| TW | 202127971 | 7/2021 |

* cited by examiner

Primary Examiner — J. E. Schoenholtz
(74) Attorney, Agent, or Firm — JCIPRNET

(57) ABSTRACT

A display device, including a flexible substrate, multiple lighting units, and multiple signal lines, is provided. The lighting units and the signal lines are located on the flexible substrate, and the signal lines are respectively electrically connected to the lighting units. Each signal line includes multiple first conductive patterns, at least one second conductive pattern, and at least one third conductive pattern. The first conductive patterns are located on the flexible substrate. The second conductive pattern is located on the first conductive patterns, and two ends of each second conductive pattern are respectively connected to two first conductive patterns. In a stretched state, the two first conductive patterns twist the commonly connected second conductive pattern. The third conductive pattern is superimposed on the second conductive pattern.

14 Claims, 5 Drawing Sheets

DISPLAY DEVICE

CROSS-REFERENCE TO RELATED APPLICATION

This application claims the priority benefit of Taiwan application serial no. 110125760, filed on Jul. 13, 2021. The entirety of the above-mentioned patent application is hereby incorporated by reference herein and made a part of this specification.

BACKGROUND

Technical Field

The disclosure relates to a display device, and particularly relates to a display device with improved stretchability.

Description of Related Art

With the continuous development of display devices, the characteristics of stretchability, flexibility, and unrestricted appearance have gradually received attention to meet the requirements of users to stretch or bend the display devices at will. However, due to insufficiency in stretchability, the current stretchable display devices are often prone to breakage of metal conducting wires due to excessive stretch, resulting in a decrease in product yield and reliability.

SUMMARY

The disclosure provides a display device with improved stretchability.

An embodiment of the disclosure provides a display device, which includes a flexible substrate; multiple lighting units located on the flexible substrate; and multiple signal lines located on the flexible substrate and respectively electrically connected to the lighting units. Each signal line includes multiple first conductive patterns located on the flexible substrate; at least one second conductive pattern located on the first conductive patterns, two ends of each second conductive pattern being respectively connected to the two first conductive patterns, and in a stretched state, the two first conductive patterns twisting the commonly connected second conductive pattern; and at least one third conductive pattern superimposed on the second conductive pattern.

In an embodiment of the disclosure, in the stretched state, the two first conductive patterns cause a consistent torque to the third conductive pattern superimposed on the commonly connected second conductive pattern.

In an embodiment of the disclosure, materials of the first conductive pattern and the third conductive pattern are same.

In an embodiment of the disclosure, the third conductive pattern and the second conductive pattern completely overlap.

In an embodiment of the disclosure, an area of the second conductive pattern is greater than or equal to an area of the third conductive pattern, and the area of the second conductive pattern is less than or equal to 1.5 times the area of the third conductive pattern.

In an embodiment of the disclosure, an overlapping area between the second conductive pattern and the first conductive patterns accounts for 50 to 70% of an area of the second conductive pattern.

In an embodiment of the disclosure, a spacing between the second conductive pattern or between the third conductive pattern is between 2 μm and 30 μm.

In an embodiment of the disclosure, a Young's modulus of the second conductive pattern is less than a Young's modulus of the first conductive pattern or the third conductive pattern.

In an embodiment of the disclosure, a Young's modulus of the second conductive pattern is between 10 KPa and 10 GPa.

In an embodiment of the disclosure, a resistivity of the first conductive pattern or the third conductive pattern is less than a resistivity of the second conductive pattern.

In an embodiment of the disclosure, a resistivity ratio of the second conductive pattern to the first conductive pattern or the third conductive pattern is between 2.4 and $1.67 \times 10^3$.

In an embodiment of the disclosure, the lighting units are arranged side-to-side.

In an embodiment of the disclosure, the lighting units are arranged diagonally.

In an embodiment of the disclosure, the signal lines include a data line, a scan line, and a power line, and a length of the power line is less than a length of the data line or the scan line.

In order for the features and advantages of the disclosure to be more comprehensible, the following specific embodiments are described in detail in conjunction with the accompanying drawings.

DETAILED DESCRIPTION OF DISCLOSED EMBODIMENTS

Figure 1A:
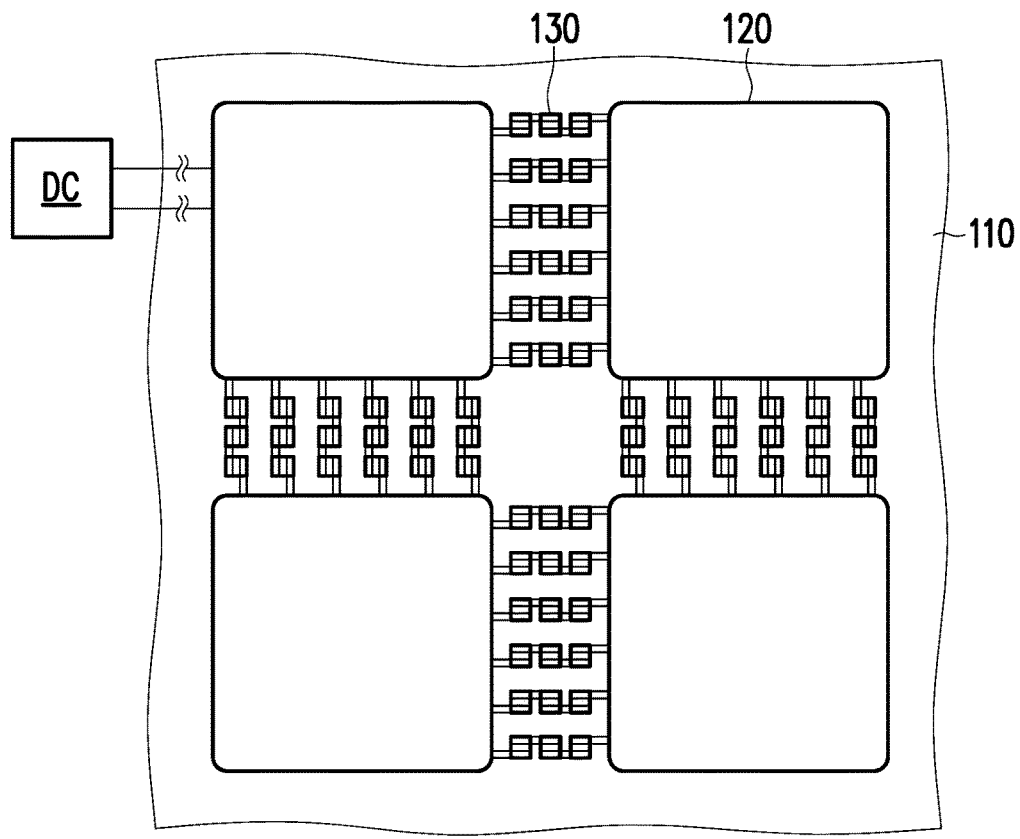
FIG. 1A is a partial top schematic view of a display device 10 according to an embodiment of the disclosure.

Considering the measurement in discussion and the specific amount of measurement-related error (that is, the limitation of the measurement system), "about", "approximately", or "substantially" used herein includes a stated value and an average value within an acceptable range of deviation from a specific value determined by persons skilled in the art. For example, "about" may mean within one or more standard deviations or within ±30%, ±20%, ±10%, or ±5% of the stated value. Furthermore, a more acceptable range of deviation or standard deviation may be selected for "about", "approximately", or "substantially" used herein according to optical properties, etching properties, or other properties, instead of using one standard deviation for all properties.

In addition, relative terms such as "lower" or "bottom" and "upper" or "top" may be used herein to describe the relationship between one element and another element, as shown in the drawings. It should be understood that relative terms are intended to include different orientations of a device in addition to the orientation shown in the drawings. For example, if the device in a drawing is flipped, an element described as being on the "lower" side of other elements will be oriented on the "upper" side of the other elements. Therefore, the exemplary term "lower" may include the orientations of "lower" and "upper", depending on the specific orientation of the drawing. Similarly, if the device in a drawing is flipped, an element described as being "below" or "beneath" other elements will be oriented "above" the other elements. Therefore, the exemplary term "below" or "beneath" may include the orientations of above and below.

Figure 1B:
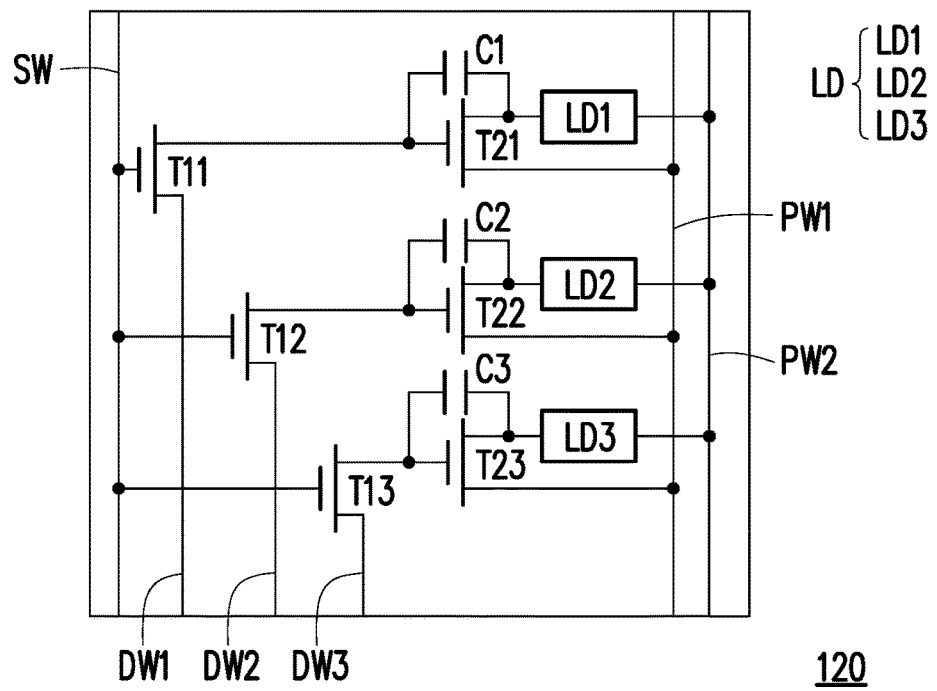
FIG. 1B is an enlarged schematic view of a lighting unit 120 of the display device 10 of FIG. 1A.
Figure 1C:
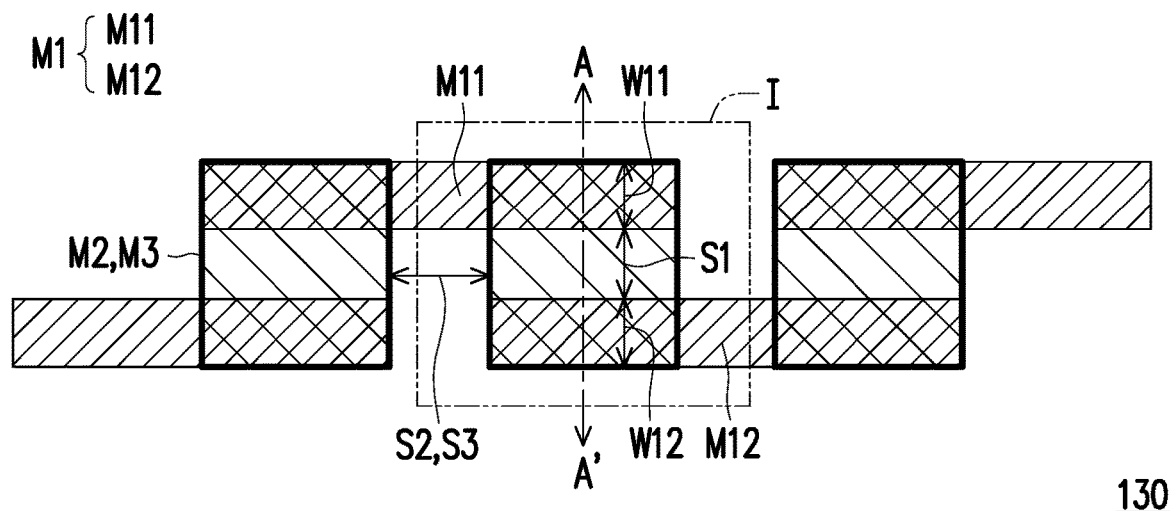
FIG. 1C is an enlarged schematic view of a signal line 130 of the display device 10 of FIG. 1A.
Figure 1D:
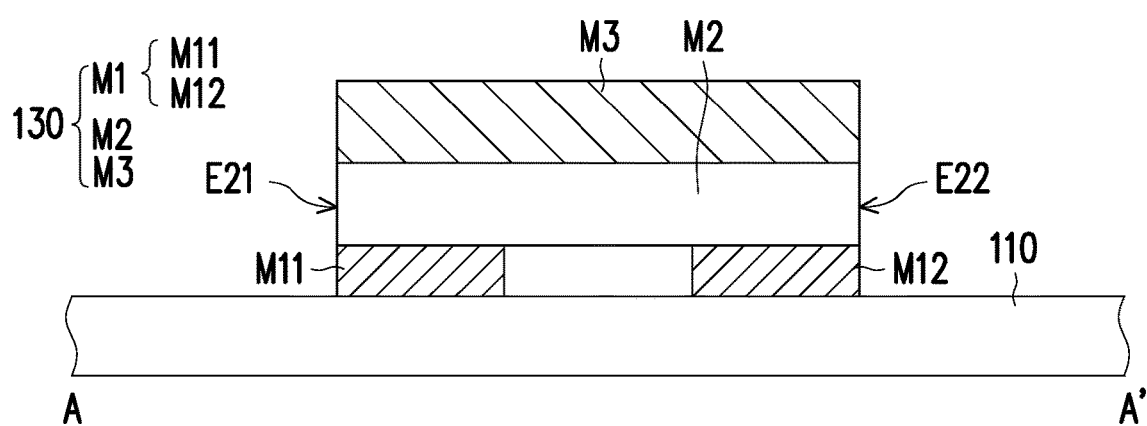
FIG. 1D is a cross-sectional schematic view taken along a section line A-A' of FIG. 1C.
Figure 1E:
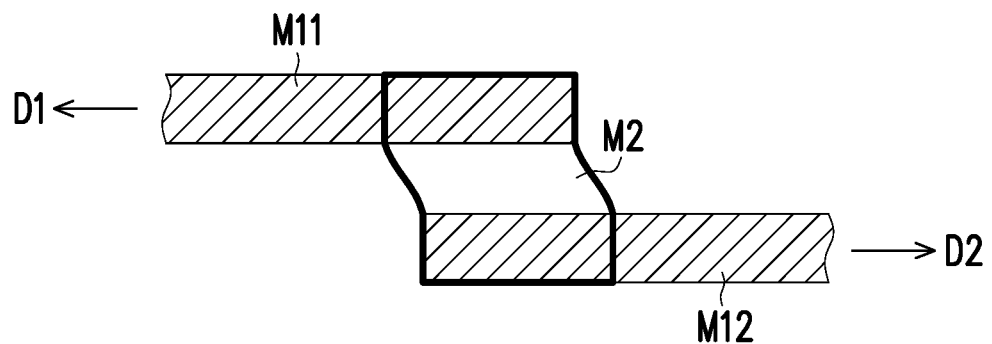
FIG. 1E and FIG. 1F are enlarged schematic views of a region I of the signal line 130 of FIG. 1C in a stretched state.
Figure 1F:
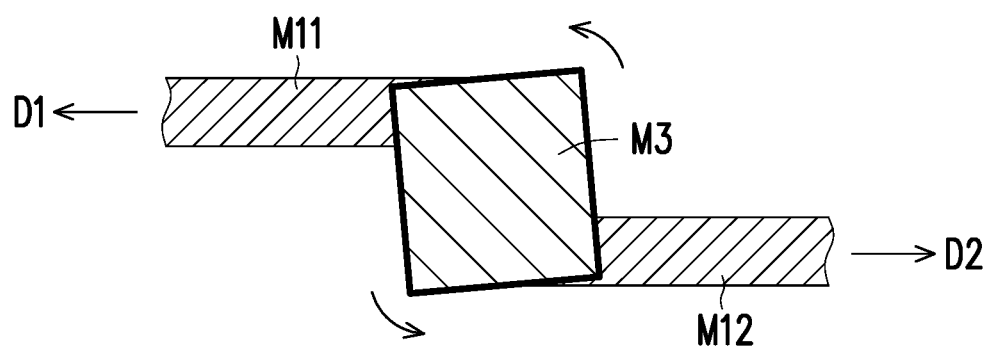

FIG. 1A is a partial top schematic view of a display device 10 according to an embodiment of the disclosure. FIG. 1B is an enlarged schematic view of a lighting unit 120 of the display device 10 of FIG. 1A. FIG. 1C is an enlarged schematic view of a signal line 130 of the display device 10 of FIG. 1A. FIG. 1D is a cross-sectional schematic view taken along a section line A-A' of FIG. 1C. FIG. 1E and FIG. 1F are enlarged schematic views of a region I of the signal line 130 of FIG. 1C in a stretched state. In order for the expression of the drawings to be clearer, a third conductive pattern M3 of the signal line 130 is omitted in FIG. 1E.

Please refer to FIG. 1A to FIG. 1E at the same time. The display device 10 includes a flexible substrate 110, multiple lighting units 120, and multiple signal lines 130. The lighting units 120 are located on the flexible substrate 110. The signal lines 130 are located on the flexible substrate 110 and are respectively electrically connected to the lighting units 120. Each signal line 130 includes multiple first conductive patterns M1, at least one second conductive pattern M2, and at least one third conductive pattern M3. The first conductive patterns M1a re located on the flexible substrate 110. The second conductive pattern is located on the first conductive patterns M1, wherein the two ends of each second conductive pattern M2 are respectively connected to two first conductive patterns M1, and in a stretched state, the two first conductive patterns M1 twist the commonly connected second conductive pattern M2. The third conductive pattern M3 is superimposed on the second conductive pattern M2.

In the display device 10 of an embodiment of the disclosure, by disconnecting the first conductive patterns M1, the strain of the first conductive patterns M1 in the stretched state may be reduced. In addition, by using the second conductive pattern M2 to bridge the disconnected first conductive patterns M1, the overall tensile stress withstood by the signal lines 130 in the stretched state can be dispersed, thereby improving the stretchability of the display device 10. In addition, by superimposing the third conductive pattern M3 on the second conductive pattern M2, the overall conductivity of the signal lines 130 may be improved.

Hereinafter, in conjunction with FIG. 1A to FIG. 1E, the implementation of each element and film layer of the display device 10 will be described, but the disclosure is not limited thereto.

Please refer to FIG. 1A. In the embodiment, the flexible substrate 110 of the display device 10 may be used to carry the lighting units 120 and the signal lines 130. The material of the flexible substrate 110 may be polyimide (PI), polycarbonate (PC), polyester (PET), cyclic olefin copolymer (COC), metallocene-based cyclic olefin copolymer (mCOC), or other suitable materials, but the disclosure is not limited thereto.

In the embodiment, the display device 10 may further include a drive element DC, and the drive element DC may be electrically connected to the lighting units 120 to transmit signals to the lighting units 120. In some embodiments, the drive element DC may be a chip bonded to the flexible substrate 110 or a circuit element (including an active element, a passive element, or a combination thereof) directly formed on the flexible substrate 110. In some embodiments, the drive element DC may be electrically connected to the lighting units 120 via the signal lines 130.

The lighting units 120 of the display device 10 may be arranged in an array. For example, in the embodiment, the lighting units 120 may be arranged side-to-side, and the signal lines 130 may be arranged in parallel between adjacent lighting units 120 to transmit signals between the lighting units 120. In addition, the signal line 130 may have an approximately straight contour, so that the length of the signal line 130 may be roughly equal to a spacing between the lighting units 120, and the lengths of the signal lines 130 are the same, but are not limited thereto.

Please refer to FIG. 1B. Each lighting unit 120 may, for example, constitute a pixel or a sub-pixel of the display device 10. The lighting unit 120 may include a lighting element LD, and the lighting element LD may be, for example, a micro light emitting diode, an organic light emitting diode, or other self-luminous elements. For example, in the embodiment, each lighting unit 120 may include three lighting elements LD1, LD2, and LD3, and the three lighting elements LD1, LD2, and LD3 may respectively have different light colors. For example, the lighting element LD1 may emit red light, the lighting element LD2 may emit green light, and the lighting element LD3 may emit blue light, so that each lighting unit 120 may constitute a pixel of the display device 10, thereby implementing full color display. However, there is no particular limitation on the number or light color of the lighting element LD. In some embodiments, each lighting unit 120 may include one, two, four, or more lighting elements LD.

In the embodiment, the lighting unit 120 may further include a drive circuit. For example, please refer to FIG. 1B. The lighting unit 120 may adopt a 2T1C active drive circuit, and the lighting unit 120 may include selective transistors T11, T12, and T13, drive transistors T21, T22, and T23, and storage capacitors C1, C2, and C3 respectively disposed corresponding to the lighting elements LD1, LD2, and LD3. Gates of the selective transistors T11, T12, and T13 may be electrically connected to the corresponding signal line 130 via a conducting wire SW to receive gate signals via the corresponding signal line 130. Sources of the selective transistors T11, T12, and T13 may be respectively electrically connected to the corresponding signal line 130 via conducting wires DW1, DW2, and DW3 to respectively receive source signals via the corresponding signal line 130. Drains of the selective transistors T11, T12, and T13 are respectively electrically connected to gates of the drive transistors T21, T22, and T23 to control the on or off of the drive transistors T21, T22, and T23. Sources of the drive transistors T21, T22, and T23 and cathodes of the lighting elements LD1, LD2, and LD3 may be respectively electrically connected to the corresponding signal line 130 via conducting wires PW1 and PW2 to be respectively electrically connected to a power source or the drive element DC via the corresponding signal line 130. Drains of the drive transistors T21, T22, and T23 may be respectively electrically connected to anodes of the lighting elements LD1, LD2, and LD3. In addition, two ends of the storage capacitors C1, C2, and C3 may be respectively electrically connected to drains of the selective transistors T11, T12, and T13 and drains of the drive transistors T21, T22, and T23.

The selective transistors T11, T12, and T13 and the drive transistors T21, T22, and T23 may respectively provide stable currents for the lighting elements LD1, LD2, and LD3 within a screen time. In addition, the storage capacitors C1, C2, and C3 may maintain gate voltages of the drive transistors T21, T22, and T23 after scan signal pulses of the selective transistors T11, T12, and T13 end, thereby providing continuous drive currents to the lighting elements LD1, LD2, and LD3 until the screen time ends.

Please refer to FIG. 1C and FIG. 1D at the same time. The signal line 130 may be composed of the first conductive pattern M1, the second conductive pattern M2, and the third conductive pattern M3. The first conductive pattern M1, the second conductive pattern M2, and the third conductive pattern M3 respectively belong to different film layers. Two ends of the first conductive pattern M1a re connected to two different second conductive patterns M2, and two ends of the second conductive pattern M2 are connected to two different first conductive patterns M1. In the embodiment, the first conductive pattern M1 has a rectangular appearance, and the second conductive pattern M2 and the third conductive pattern M3 have square appearances, but not limited thereto. In addition, the second conductive pattern M2 and the third conductive pattern M3 are arranged in a horizontal direction with a fixed spacing S2. The first conductive pattern M1 is staggered between the second conductive pattern M2 and the flexible substrate 110. For example, the first conductive pattern M1 includes a first conductive pattern M11 and a first conductive pattern M12. The first conductive pattern M11 connects upper end portions of two adjacent second conductive patterns M2, and the first conductive pattern M12 connects lower end portions of two adjacent second conductive patterns M2.

The first conductive patterns M1a re electrically separated from each other and may belong to the same film layer, but may also belong to different film layers. The second conductive patterns M2 are electrically separated from each other and may belong to the same film layer, but may also belong to different film layers. The third conductive patterns M3 are electrically separated from each other and may belong to the same film layer, but may also belong to different film layers. In addition, the shapes and sizes of the first conductive pattern M1, the second conductive pattern M2, and the third conductive pattern M3 are not particularly limited, as long as there is no unnecessary electrical connection between the individual first conductive pattern M1, second conductive pattern M2, and third conductive pattern M3 and other conducting wires and conductors, and the shapes and sizes of the first conductive pattern M1, the second conductive pattern M2, and the third conductive pattern M3 shown in the drawings are only examples.

The first conductive pattern M1 may have good conductivity and rigidity. Specifically, the material of the first conductive pattern M1 may have a relatively small resistivity. For example, the resistivity of the first conductive pattern M1 may be between $1.5 \times 10^{-5}$ and $5 \times 10^{-4}$ $\Omega$*mm. In addition, the material of the first conductive pattern M1 may have a relatively large Young's modulus. For example, the Young's modulus of the first conductive pattern M1 may be between 10 GPa and 300 GPa. For example, the first conductive pattern M1 may include metal materials such as silver, copper, and aluminum, or an alloy thereof.

The second conductive pattern M2 may have good stretchability. Specifically, compared with the first conductive pattern M1, the material of the second conductive pattern M2 may have a smaller Young's modulus. For example, the Young's modulus of the second conductive pattern M2 may be between 10 KPa and 10 GPa. In addition, compared with the first conductive pattern M1, the material of the second conductive pattern M2 may have a greater resistivity. For example, the resistivity ratio of the second conductive pattern M2 to the first conductive pattern M1 may be between 2.4 and $1.67 \times 10^3$. For example, the resistivity of the second conductive pattern M2 may be between $1.2 \times 10^{-3}$ to $2.5 \times 10^{-2}$ $\Omega$*mm. For example, the second conductive pattern M2 may include conductive oxides (such as indium tin oxide, zinc aluminum oxide, zinc gallium oxide, and zinc indium oxide), conductive polymers (such as PEDOT:PSS), metal nanowires (such as silver nanowires), or a combination thereof.

The third conductive pattern M3 may have good conductivity. Specifically, compared with the second conductive pattern M2, the material of the third conductive pattern M3 may have a smaller resistivity. For example, the resistivity ratio of the second conductive pattern M2 to the third conductive pattern M3 may be between 2.4 and $1.67 \times 10^3$. For example, the resistivity of the third conductive pattern M3 may be between $1.5 \times 10^{-5}$ and $5 \times 10^{-4}$ $\Omega$*mm. In addition, compared with the second conductive pattern M2, the material of the third conductive pattern M3 may have a greater Young's modulus. For example, the Young's modulus of the third conductive pattern M3 may be between 10 GPa and 300 GPa. For example, the third conductive pattern M3 may include metal materials such as silver, copper, and aluminum, or an alloy thereof, and the materials of the third conductive pattern M3 and the first conductive pattern M1 may be the same or different.

The number of first conductive patterns M1, second conductive patterns M2, and third conductive patterns M3 is not particularly limited and may be adjusted according to the length of the signal line 130. For example, as shown in FIG. 1C, since two ends of the second conductive pattern M2 are used to bridge two first conductive patterns M1, in a case where the signal line 130 has a shorter length, for example, when the length of the signal line 130 is the length of the region I, the signal line 130 may only include two first conductive patterns M1, one second conductive pattern M2, and one third conductive pattern M3.

The overlapping area between the second conductive pattern M2 and the first conductive pattern M11 and the first conductive pattern M12 is not particularly limited. For example, in the embodiment, an end portion E21 of the second conductive pattern M2 overlaps with and physically connects to the first conductive pattern M11, while an end portion E22 of the second conductive pattern M2 overlaps with and physically connects to the first conductive pattern M12. A width W11 of the first conductive pattern M11 may be equal to a width W12 of the first conductive pattern M12, and the width W11 of the first conductive pattern M11 may be equal to a spacing S1 between the first conductive pattern M11 and the first conductive pattern M12. In this case, the overlapping area between the second conductive pattern M2 and the first conductive pattern M11 and the first conductive pattern M12 may account for about 66.7% of the area of the second conductive pattern M2. In some embodiments, considering the actual processing capability, the overlapping area between the second conductive pattern M2 and the first conductive pattern M11 and the first conductive pattern M12 may account for about 50% to 70% of the area of the second conductive pattern M2, and increasing the overlapping area between the second conductive pattern M2 and the first conductive pattern M11 and the first conductive pattern M12 may reduce the overall resistance value of the signal lines 130, while increasing the tensile strength of the second conductive pattern M2 to the first conductive pattern M11 and the first conductive pattern M12 in the stretched state.

In the embodiment, the third conductive pattern M3 is superimposed on the second conductive pattern M2, and the third conductive pattern M3 may be physically connected to the second conductive pattern M2 to reduce the resistance between the first conductive patterns M1, thereby improving the overall conductivity of the signal lines 130. The size relationship between the third conductive pattern M3 and the second conductive pattern M2 is not particularly limited. In some embodiments, the area of the second conductive pattern M2 may be greater than or equal to the area of the third conductive pattern M3, and the area of the second conductive pattern M2 may be less than or equal to 1.5 times the area of the third conductive pattern M3.

The third conductive pattern M3 and the second conductive pattern M2 may partially overlap or completely overlap. For example, in the embodiment, the areas of the third conductive pattern M3 and the second conductive pattern M2 are the same, and the third conductive pattern M3 and the second conductive pattern M2 may completely overlap. In this case, the spacing S2 between the second conductive patterns M2 and a spacing S3 between the third conductive patterns M3 may be the same, and the overlapping area between the third conductive pattern M3 and the first conductive pattern M11 and the first conductive pattern M12 may also account for about 50% to 70% of the area of the third conductive pattern M3.

Please refer to FIG. 1E and FIG. 1F. When the display device 10 is in the stretched state, the signal line 130 is stretched and extended. At this time, for example, the first conductive pattern M11 withstands a pulling force in a direction D1 and stretches the second conductive pattern M2 towards the direction D1, and the first conductive pattern M12 withstands a pulling force in a direction D2 and stretches the second conductive pattern M2 towards the direction D2, so that the second conductive pattern M2 is twisted, as shown in FIG. 1E, while the second conductive pattern M2 drives the third conductive pattern M3 thereon to rotates, as shown in FIG. 1F. In the stretched state, the first conductive pattern M11 and the first conductive pattern M12 may cause a consistent torque to the third conductive pattern M3 on the commonly connected second conductive pattern M2. In this way, in the stretched state, by the twisting or rotation of each of the second conductive pattern M2 and the third conductive pattern M3, the overall tensile stress withstood by the signal lines 130 can be dispersed and the strain of the first conductive pattern M1 can be reduced, so that the signal lines 130 can withstand a greater stretch, thereby improving the stretchability of the display device 10.

When the length of the signal line 130 and the sizes of the first conductive pattern M1, the second conductive pattern M2, and the third conductive pattern M3 are fixed, the smaller the spacing S2, the greater the number of second conductive patterns M2 with the smaller Young's modulus in the signal line 130, and the greater the stretch that the signal line 130 can withstand, that is, the higher the stretchability of the signal line 130. At the same time, the number of first conductive patterns M1 bridged by the second conductive pattern M2 is also greater. In this way, more first conductive patterns M1 can disperse the stress withstood by the signal line 130 in the stretched state, thereby reducing the strain of the individual first conductive pattern M1 in the stretched state. The spacing S2 between the second conductive patterns M2 and the spacing S3 between the third conductive patterns M3 may be determined according to the resolution and processing capability of the display device 10. For example, in the embodiment, the spacing S2 and the spacing S3 may be between 2 μm and 30 μm.

Figure 2:
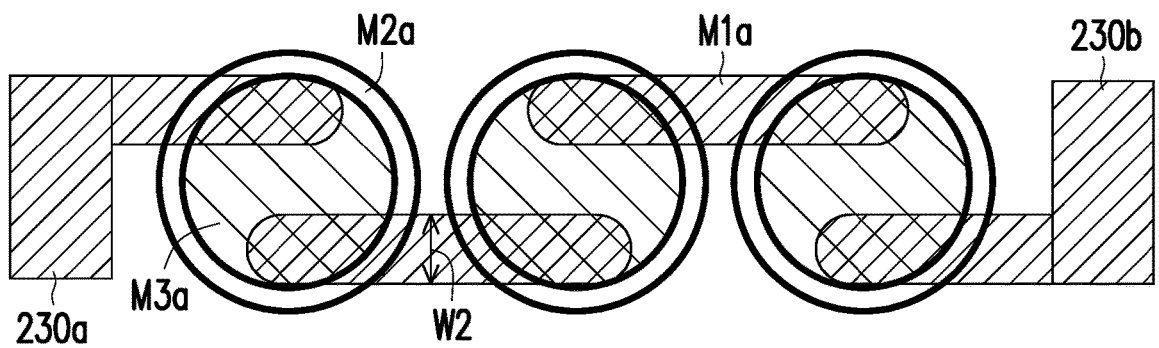
FIG. 2 is a top schematic view of a signal line 230 according to an embodiment of the disclosure.

FIG. 2 is a top schematic view of a signal line 230 according to an embodiment of the disclosure. In the embodiment, the signal line 230 may include a first conductive pattern M1a, a second conductive pattern M2a, and a third conductive pattern M3a. Compared with the signal line 130 shown in FIG. 1C, the signal line 230 shown in FIG. 2 is different in that two ends of the first conductive pattern M1a have arc-shaped contours; the second conductive pattern M2a and the third conductive pattern M3a have circular upper surface contours; the area of the second conductive pattern M2a is greater than the area of the third conductive pattern M3a; and the signal line 230 also includes connecting portions 230a and 230b disposed at two ends.

In the embodiment, the central axis of the third conductive pattern M3a overlaps with the central axis of the second conductive pattern M2a, and the area of the second conductive pattern M2a is about 1.5 times the area of the third conductive pattern M3a to increase the contact area between the second conductive pattern M2a and the first conductive pattern M1a. In addition, one ends of the connecting portions 230a and 230b may be respectively connected to the first conductive patterns M1a at two ends of the signal line 230, and the other ends of the connecting portions 230a and 230b may be respectively connected to different lighting units 120 to increase the connecting area between the signal line 230 and the lighting units 120. When the signal line 230 is in the stretched state, by the twisting or rotation of each of the second conductive pattern M2a and the third conductive pattern M3a, the overall tensile stress withstood by the signal lines 230 can be dispersed, so that the signal lines 230 can withstand a greater stretch.

Figure 3:
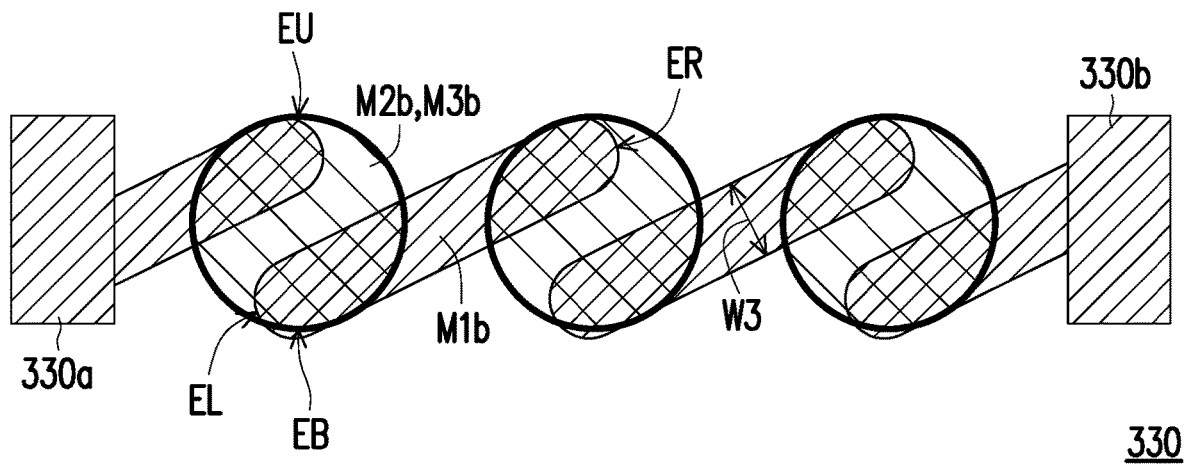
FIG. 3 is a top schematic view of a signal line 330 according to an embodiment of the disclosure.

FIG. 3 is a top schematic view of a signal line 330 according to an embodiment of the disclosure. In the embodiment, the signal line 330 may include a first conductive pattern M1b, a second conductive pattern M2b, a third conductive pattern M3b, and connecting portions 330a and 330b disposed at two ends. Compared with the signal line 230 shown in FIG. 2, the signal line 330 shown in FIG. 3 is different in that an end portion EL of the first conductive pattern M1b is connected to an end portion EB of the second conductive pattern M2b, and an end portion ER of the first conductive pattern M1b is connected to an end portion EU of the second conductive pattern M2b; the second conductive pattern M2b and the third conductive pattern M3b completely overlap and have the same area; and a width W3 of the first conductive pattern M1b is greater than a width W2 of the first conductive pattern M1a to increase the overlap area between the first conductive pattern M1b and the second conductive pattern M2b. In addition, when the signal line 330 is in the stretched state, by the twisting or rotation of each of the second conductive pattern M2b and the third conductive pattern M3b, the overall tensile stress withstood by the signal lines 330 can be dispersed, so that the signal lines 330 can withstand a greater stretch.

Figure 4:
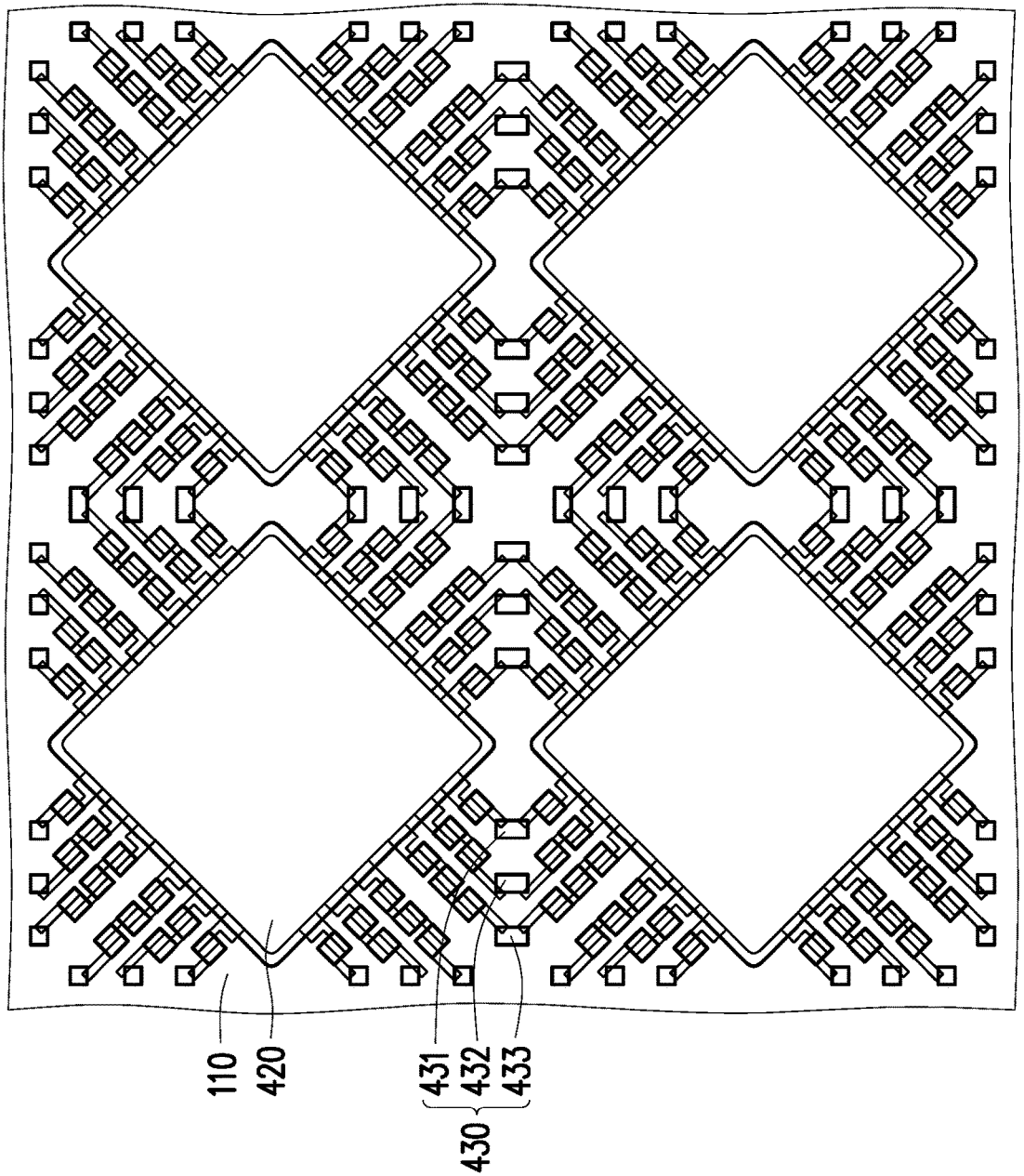
FIG. 4 is a partial top schematic view of a display device 40 according to an embodiment of the disclosure.

FIG. 4 is a partial top schematic view of a display device 40 according to an embodiment of the disclosure. In FIG. 4, the display device 40 may be regarded as another implementation aspect of the display device 10 of FIG. 1A to FIG. 1F, and the display device 40 may have all the components of the display device 10. Therefore, the embodiment continues to use the same or similar reference numerals and related content as the embodiment of FIG. 1A to FIG. 1F.

In the embodiment, the display device 40 includes a flexible substrate 110, multiple lighting units 420, and multiple signal lines 430. The lighting units 420 and the signal lines 430 are disposed on the flexible substrate 110, and the signal lines 430 are electrically connected to the lighting units 420. The lighting unit 420 may have the same or similar structure as the lighting unit 120 shown in FIG. 1B. The signal line 430 may have the same or similar structure as the signal line 130 shown in FIG. 1C, the signal line 230 shown in FIG. 2, or the signal line 330 shown in FIG. 3, or the signal line 430 may include a structure formed by combining at least two of the signal line 130 shown in FIG. 1C, the signal line 230 shown in FIG. 2, and the signal line 330 shown in FIG. 3 being electrically connected. Therefore, the signal line 430 can withstand a greater stretch, which helps to improve the stretchability of the display device 40.

Compared with the display device 10 shown in FIG. 1A, the display device 40 shown in FIG. 4 is different in that the lighting units 420 of the display device 40 are arranged diagonally; and the signal lines 430 include signal lines 431, 432, and 433, wherein the length of the signal line 431 is less than the length of the signal line 432, and the length of the signal line 432 is less than the length of the signal line 433.

In the embodiment, the signal lines 431, 432, and 433 all have L-shaped contours and are arranged in parallel between adjacent lighting units 420. The lengths of the signal lines 431, 432, and 433 are different to maximize the space utilization between the lighting units 420. Since the length of the signal line 431 is the shortest, the signal line 431 has a lower resistance value than the signal lines 432 and 433. Therefore, the signal line 431 may be used as, for example, a power line to avoid fusing, and the signal lines 432 and 433 may be used as, for example, scan lines or data lines.

In summary, the display device of the disclosure can reduce the strain of the individual first conductive pattern in the stretched state by disconnecting the first conductive pattern. In addition, by setting the second conductive pattern with the smaller Young's modulus to bridge the disconnected first conductive pattern, the overall tensile stress withstood by the signal lines in the stretched state can be dispersed to increase the stretch that the signal lines can withstand, thereby improving the stretchability of the display device. In addition, by superimposing the third conductive pattern on the second conductive pattern, the overall conductivity of the signal lines can be improved.

Although the disclosure has been disclosed in the above embodiments, the embodiments are not intended to limit the disclosure. Persons skilled in the art may make some changes and modifications without departing from the spirit and scope of the disclosure. The protection scope of the disclosure shall be defined by the appended claims.

What is claimed is:

1. A display device, comprising:
    a flexible substrate;
    a plurality of lighting units, located on the flexible substrate; and
    a plurality of signal lines, located on the flexible substrate and respectively electrically connected to the lighting units, wherein each of the signal lines comprises:
    a plurality of first conductive patterns, located on the flexible substrate;
    at least one second conductive pattern, located on the first conductive patterns, wherein two ends of each of the second conductive pattern are respectively connected to the two first conductive patterns, and in a stretched state, the two first conductive patterns twist the commonly connected second conductive pattern; and
    at least one third conductive pattern, superimposed on the second conductive pattern.

2. The display device according to claim 1, wherein in the stretched state, the two first conductive patterns cause a consistent torque to the third conductive pattern superimposed on the commonly connected second conductive pattern.

3. The display device according to claim 1, wherein materials of the first conductive pattern and the third conductive pattern are same.

4. The display device according to claim 1, wherein the third conductive pattern and the second conductive pattern completely overlap.

5. The display device according to claim 1, wherein an area of the second conductive pattern is greater than or equal to an area of the third conductive pattern, and the area of the second conductive pattern is less than or equal to 1.5 times the area of the third conductive pattern.

6. The display device according to claim 1, wherein an overlapping area between the second conductive pattern and the first conductive patterns accounts for 50 to 70% of an area of the second conductive pattern.

7. The display device according to claim 1, wherein a spacing between the second conductive pattern or between the third conductive pattern is between 2 μm and 30 μm.

8. The display device according to claim 1, wherein a Young's modulus of the second conductive pattern is less than a Young's modulus of the first conductive pattern or the third conductive pattern.

9. The display device according to claim 1, wherein a Young's modulus of the second conductive pattern is between 10 KPa and 10 GPa.

10. The display device according to claim 1, wherein a resistivity of the first conductive pattern or the third conductive pattern is less than a resistivity of the second conductive pattern.

11. The display device according to claim 1, wherein a resistivity ratio of the second conductive pattern to the first conductive pattern or the third conductive pattern is between 2.4 and $1.67 \times 10^3$.

12. The display device according to claim 1, wherein the lighting units are arranged side-to-side.

13. The display device according to claim 1, wherein the lighting units are arranged diagonally.

14. The display device according to claim 13, wherein the signal lines comprise a data line, a scan line, and a power line, and a length of the power line is less than a length of the data line or the scan line.

* * * * *